United States Patent
Liu et al.

(10) Patent No.: US 9,293,303 B2
(45) Date of Patent: Mar. 22, 2016

(54) LOW CONTAMINATION CHAMBER FOR SURFACE ACTIVATION

(71) Applicant: Taiwan Semiconductor Manufacturing Company, Ltd., Hsin-Chu (TW)

(72) Inventors: Ping-Yin Liu, Yonghe (TW); Xin-Hua Huang, Xihu Township (TW); Lee-Chuan Tseng, New Taipei (TW); Lan-Lin Chao, Sindian (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 174 days.

(21) Appl. No.: 14/015,556

(22) Filed: Aug. 30, 2013

(65) Prior Publication Data

US 2015/0064810 A1     Mar. 5, 2015

(51) Int. Cl.
*H01J 37/32* (2006.01)
*H01L 21/3065* (2006.01)
*C23C 16/455* (2006.01)

(52) U.S. Cl.
CPC ..... *H01J 37/32568* (2013.01); *C23C 16/45565* (2013.01); *H01J 37/3244* (2013.01); *H01J 37/32862* (2013.01); *H01J 37/32917* (2013.01); *H01J 37/32972* (2013.01); *H01L 21/3065* (2013.01)

(58) Field of Classification Search
CPC  C23C 16/4405; C23C 16/5096; C23C 16/00; H01J 37/32862; H01J 37/32568
See application file for complete search history.

(56) References Cited

U.S. PATENT DOCUMENTS

| | | | |
|---|---|---|---|
| 6,178,919 B1 * | 1/2001 | Li et al. | 118/723 E |
| 8,430,995 B2 | 4/2013 | Murokh | |
| 2004/0149386 A1 * | 8/2004 | Numasawa et al. | 156/345.43 |
| 2009/0166326 A1 * | 7/2009 | Sexton et al. | 216/67 |

\* cited by examiner

*Primary Examiner* — Duy Deo
(74) *Attorney, Agent, or Firm* — Slater & Matsil, L.L.P.

(57) ABSTRACT

An embodiment low contamination chamber includes a gas inlet, an adjustable top electrode, an adjustable bottom electrode, and an outlet. The chamber is configured to adjust a distance between the adjustable top and bottom electrodes in accordance with a desired density of plasma disposed between the top electrode and the bottom electrode.

20 Claims, 3 Drawing Sheets

LOW CONTAMINATION CHAMBER FOR SURFACE ACTIVATION

BACKGROUND

In a typical semiconductor wafer bonding process, such as wafer level bonding using low temperature fusion bonding, wafers are placed in a chamber to undergo surface activation prior to bonding. The surface activation process introduces plasma over a surface of the wafer to be bonded. Depending on the type of plasma used, various chemical properties of the activated surface may be altered to improve adhesion. Subsequently, the activated wafer surface is cleaned of contaminants and bonded (e.g., to another wafer) using a suitable process (e.g., low temperature fusion bonding). In wafer-level packaging (i.e., when two wafers are bonded face-to-face), both wafers may undergo surface activation prior to bonding.

Current surface activation processes typically use a closed-type process. In a closed-type surface activation process, gas is passed between a top and bottom electrode in a sealed chamber. The electrodes excite and ionize the gas molecules, forming plasma. An issue with this approach is particle contamination caused by the chemical interaction between the plasma and materials on the wafer surface. Particle contamination is particularly prevalent in hybrid wafers (i.e., wafers having more than two types of surface material) and especially in wafers having metal on its surface. Because close-type surface activation processes occur in sealed chambers, the particles are trapped in the sealed chamber and may damage the wafer or other wafers subsequently placed in the chamber.

Open-type surface activation processes involve exhausting the gas/plasma during the activation process and may reduce the presence of particle contamination. However, open-type surface activation reduces the density of plasma in the chamber, lowering the effectiveness of the activation process and weakening subsequently formed bonds.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a surface activation chamber for wafer-level bonding of a hybrid wafer. Other embodiments may also be applied, however, to other plasma chambers such as chemical vapor deposition (CVD)/physical vapor deposition (PVD) process chambers, which use plasma for cleaning and activating various semiconductor device surfaces.

Figure 1A:
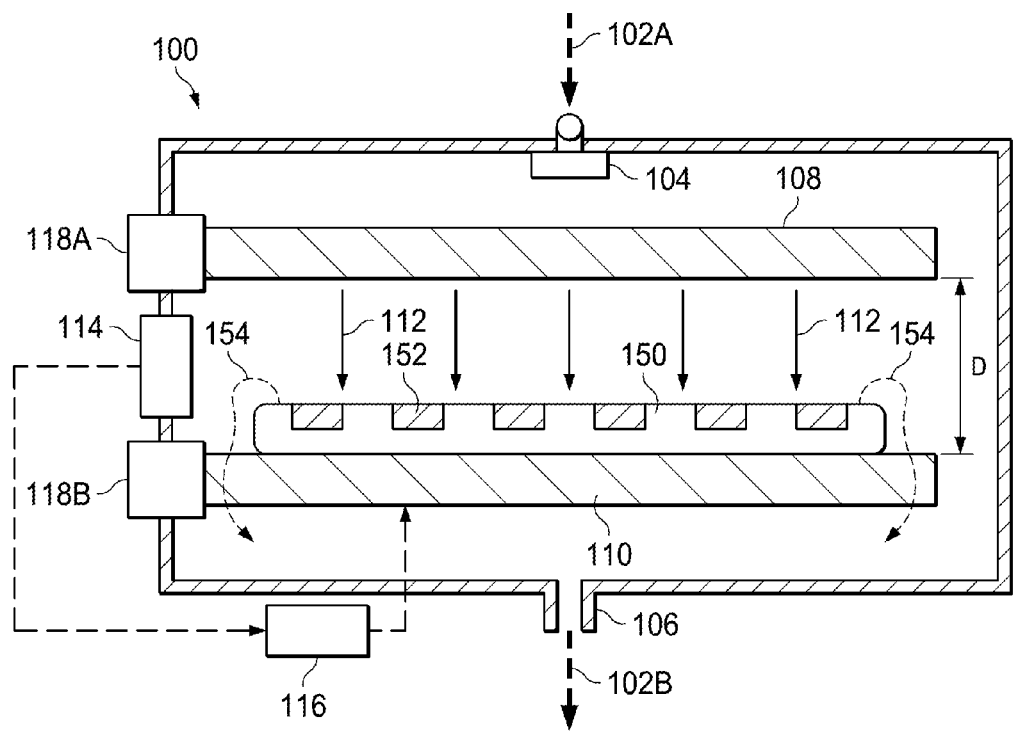
FIGS. 1A and 1B are diagrams of a low contamination chamber during a surface activation process in accordance with various embodiments.
Figure 1B:
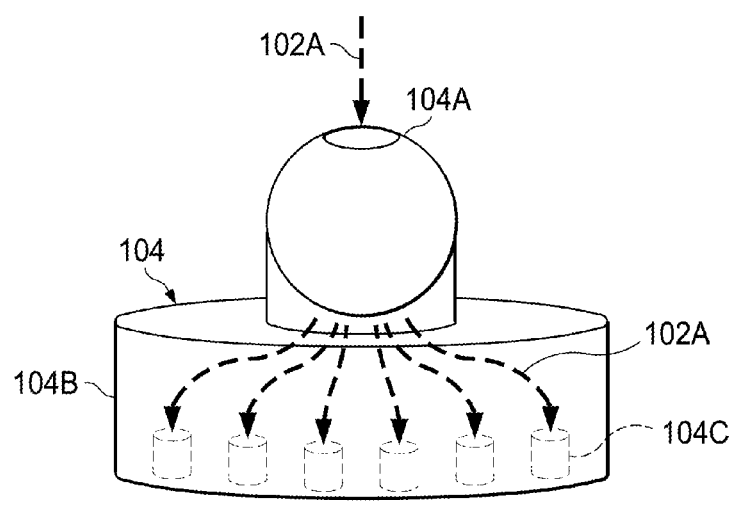

FIG. 1A illustrates a low contamination chamber 100 during a surface activation process in accordance with various embodiments. Gas is introduced (e.g., pumped) into chamber 100 through gas inlet 104 as indicated by arrow 102A. Gas inlet 104 may be a showerhead, such as showerhead 104 illustrated in FIG. 1B. Showerhead 104 may be disposed on a universal joint 104A, which allows for showerhead 104 to be moved and/or rotated as necessary. Gas flows into a showerhead body 104B from a source outside chamber 100, as indicated by arrow 102A. Shower head body 104B may include a plurality of valves 104C, which are shown in ghost in FIG. 1B. Gas flows into chamber 100 through valves 104C (indicated by arrows 102A), and valves 104C may dynamically control the gas flow speed and volume of the gas entering chamber 100. Alternatively, gas inlet 104 may be any other form of suitable nozzle, which may be capable of dynamically controlling the speed of gas flow into chamber 100.

During the surface activation process, chamber 100 is closed, but gas and plasma are exhausted from chamber 100 through outlet 106 as indicated by arrow 102B. Therefore, the surface activation process using chamber 100 is an open-type surface activation process (i.e., chamber 100 isn't sealed during the activation process), which allows for a continuous flow of gas through chamber 100 during surface activation.

A wafer 150 is placed in chamber 100 on a bottom electrode 110. Bottom electrode 110 may function as a chuck for supporting wafer 150 during the surface activation process. Wafer 150 is disposed so that the surface to be activated (e.g., the surface that will undergo a subsequent bonding process) is facing upwards in chamber 100. Wafer 150 may be a hybrid wafer having more than two types of surface materials, which may include metal features 152. For example, metal features 152 may be copper bonding pads. Surface materials of wafer 150 may further include various dielectric materials, polymers, and the like.

Chamber 100 includes adjustable top and bottom electrodes 108 and 110, respectively. Top and bottom electrodes 108 and 110 may be formed of any suitable material, such as a ceramic. During surface activation, a bias current/voltage may be applied to top and bottom electrodes 108 and 110. For example, a bias power of between about 1 W to about 10 W may be applied to top and bottom electrodes 108 and 110. As gas molecules pass between top and bottom electrodes 108 and 110, the molecules are excited by the bias power, forming radicals (i.e., ions) and converting into plasma (indicated by arrows 112). The vertical positions of top and bottom electrodes 108 and 110 may be adjusted mechanically using top and bottom manipulators 118A and 118B, respectively.

The type of gas used in chamber 100 may depend on the surface materials of wafer 150. For example, to activate a dielectric or polymer material, suitable gases may include a nitride, an oxide, ammonia ($NH_3$), $H_2$, $N_2$, combinations thereof, or the like. The plasma activates surface materials of wafer 150 so as to, for example, improve its adhesive properties in preparation for bonding to another package component such as another wafer, a package substrate, a device die, an interposer, a printed circuit board (PCB), or the like.

Adjustable top electrode 108 is separated from adjustable bottom electrode 110 by a distance D. Distance D may be adjusted to maintain a desired plasma density level in chamber 100 by adjusting the relative vertical positions of top electrode 108 and/or bottom electrode 110 using for example, top and bottom manipulators 118A and/or 118B, respectively. An example desired plasma density level during surface activation may be between about 1 W to about 4 W. For example, by mechanically adjusting top electrode 108 and bottom electrode 110 closer together (i.e., decreasing distance D) using top manipulator 118A and/or bottom manipulator 118B, the plasma generated between electrodes 108 and 110 may be more dense. In various embodiments, distance D may be maintained between about 5 mm and about 50 mm during the surface activation process. Furthermore, gas inlet 104 may also be used to increase plasma density in chamber 100, for example, by increasing the speed of gas flow into chamber 100.

An optical emission spectroscopy (OES) device 114 may be used to measure the density of plasma between top and bottom electrodes 108 and 110 (i.e., the density of plasma over the surface of wafer 150). OES device 114 measures light emitted at element-specific characteristic wavelengths from the plasma ions. The light emitted is separated from other readings and measured in a spectrometer, yielding an intensity measurement. This intensity measurement may be used to determine a plasma density level by comparing it against reference standards, which may be calibrated at OES device 114. Therefore, OES device 114 may provide real-time measurements of plasma density over wafer 150's surface.

Measurements from OES device 114 may be relayed to a plasma density self-monitoring device 116. Plasma density self-monitoring device 116 compares the measured plasma density level with a desired plasma density level and adjusts distance D accordingly. For example, if the measured plasma density level is too low to effectively activate the surface of wafer 150, plasma density self-monitoring device may decrease D by moving adjustable top electrode 108 and/or adjustable bottom electrode 110 closer together. Furthermore, plasma density self-monitoring device 116 may adjust the speed of gas flow into chamber 100 from gas inlet 104 in accordance with readings from OES device 114 (e.g., device 116 may increase flow speed if the measured plasma density is too low). Other parameters the surface activation process such a RF power could also be adjusted.

As part of the surface activation process, contaminate particles may be formed in chamber 100 due to the interaction between the plasma ions and surface materials of wafer 150. For example, the interaction between plasma ions and metal features 152 may create metal fragments in chamber 100, which may damage wafer 150 or other wafers subsequently placed in chamber 100. Because the surface activation process in chamber 100 is an open-type activation process, contaminate particles are not trapped in a sealed chamber. Instead, gas and plasma may carry contaminate particles out of chamber 100 through outlet 106. Arrows 154 illustrate the removal of contaminate particles away from wafer 150 during the surface activation process. Distance D between electrodes 108 and 110 may be maintained to create a sufficient gap to allow the easy flow of gas and plasma out of chamber 100 through outlet 106 while still maintaining a desired plasma density level. Thus, chamber 100 allows for an open-type surface activation process while still maintaining a desired plasma density level to ensure the surface of wafer 150 is properly activated. Thus, the strength of subsequently formed bonds is not weakened.

Figure 2:
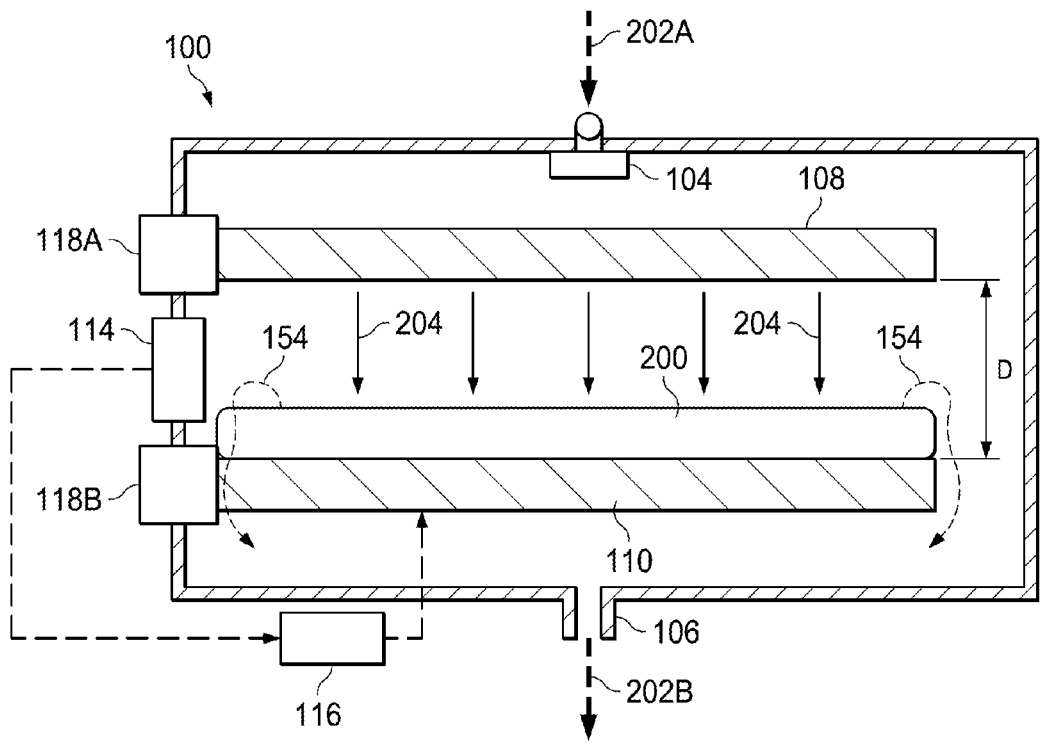
FIG. 2 is a diagram of a low contamination chamber during a chamber cleaning process in accordance with various embodiments.

FIG. 2 illustrates low contamination chamber 100 during an idle process (i.e., when a wafer surface is not being activated) in accordance with various embodiments. When chamber 100 is idle, a chamber cleaning process may be performed to remove residual trace contaminants from chamber 100.

The cleaning process may start by closing chamber 100 mechanically and opening gas inlet 104 and outlet 106 to run one or more pump/purge cycles for a rough clean. For example, a gas may be introduced and exhausted from chamber 100 to roughly purge the chamber of general contaminants. Subsequently, a gas (indicated by arrow 202A) may be flowed into chamber 100 from gas inlet 104. The gas used during the cleaning process may be the same gas or a different gas from the gas used in the surface activation process. For example, the gas used during the cleaning process may be $N_2$, $O_2$, a forming gas (e.g., a combination comprising 96% $N_2$ and 4% $O_2$), or the like. A bias power may be applied to electrodes 108 and 110, exciting the gas and forming plasma (indicated by arrow 204). Simultaneously, outlet 106 is open so that the gas and plasma be exhausted (indicated by arrow 202B) while carry residual contaminants out of chamber 100 (indicated by arrows 154). The plasma forming and gas/plasma exhaust stage of the cleaning process may last for a duration in the order of minutes.

A removable mask 200 is disposed over bottom electrode 110 during the cleaning process. Removable mask 200 may be formed of any suitable material, such as, a ceramic or Teflon and may be placed over bottom electrode 110 using any suitable means (e.g., a mechanical arm (not shown)). Removable mask 200 protects bottom electrode 110 from damage during the cleaning process and may cover an entire top surface of bottom electrode 110. For example, without removable mask 200 or a wafer disposed over bottom electrode 110, a top surface of bottom electrode 110 is exposed and easily damaged by residual contaminate particles and plasma ions. Removable mask 200 prevents this damage by covering bottom electrode 110 during the cleaning process, improving the durability of components in chamber 100. After the cleaning process, removable mask 200 may be removed so that a wafer may be placed over bottom electrode 110, e.g., for surface activation.

Figure 3A:
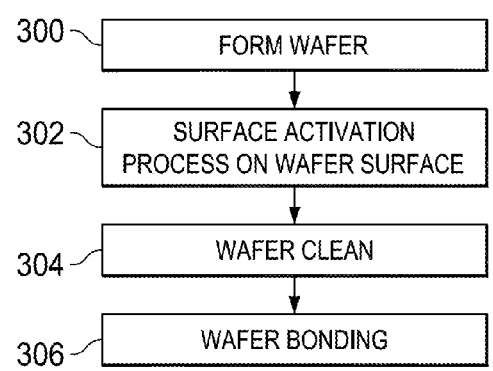
FIGS. 3A-3C are flow diagrams for wafer bonding, surface activation, and chamber cleaning processes in accordance with various embodiments.

FIG. 3A illustrates a flow diagram for wafer bonding in accordance with various embodiments. In step 300, the wafer is formed. In step 302, surface activation is performed on a surface of the wafer to be bonded. As part of the surface activation process, the wafer may be placed face up in a low contamination chamber, such as chamber 100. The wafer may be disposed between adjustable top and bottom electrodes in the chamber. A distance between the top and bottom electrodes may be adjusted to maintain a desired plasma density level during the surface activation process. Furthermore, the surface activation process may be an open-type process, where gas and plasma are exhausted from the chamber during surface activation, thus removing contaminant particles that may damage the wafer away from the chamber. As a result of the surface activation process, the surface properties of the wafer may be more adhesive, increasing the strength of subsequently formed bonds. In step 304, the wafer is cleaned, and in step 306, the wafer is bonded to another package component. The surface of the other package component may have also undergone a similar surface activation process using, for example, a low contamination chamber like chamber 100.

Figure 3B:
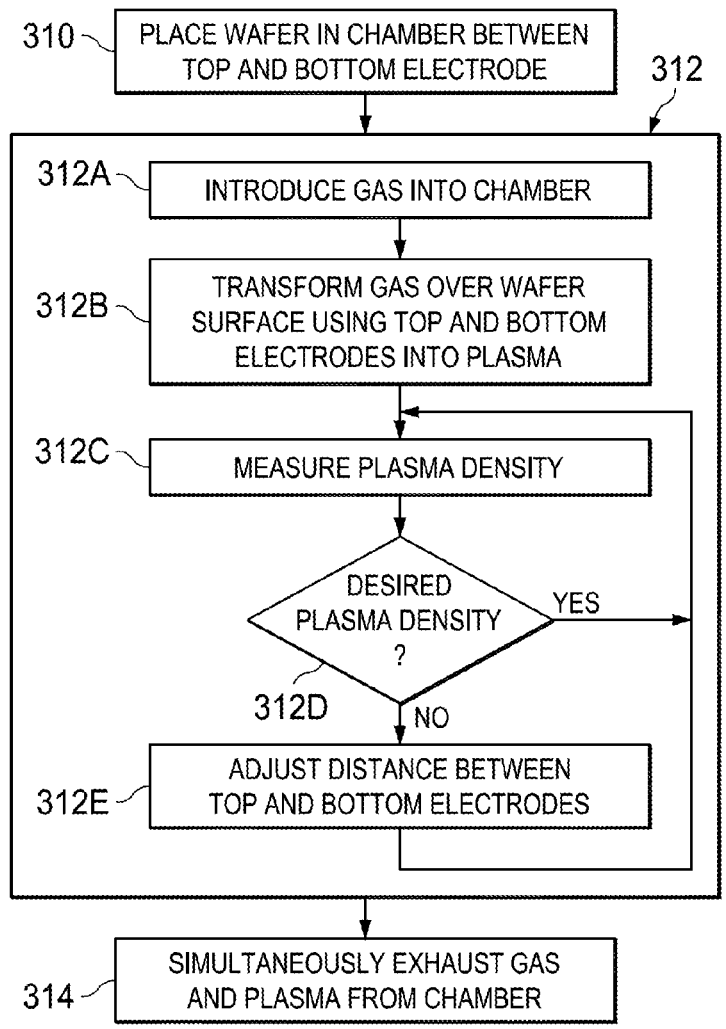

FIG. 3B illustrates a flow diagram of a surface activation process using a low contamination chamber in accordance with various embodiments. In step 310, a wafer is placed, with a surface to be activated face up, in the low contamination chamber (e.g., chamber 100) between top and bottom electrodes. The bottom electrode may act as a mechanical chuck for supporting the wafer during surface activation. In step 312, the surface of the wafer is activated. Simultaneously, in step 314, gas and plasma are exhausted from the chamber using an outlet. The exhausted gas and plasma may carry contaminant particles, which may be formed as a result of the activation process, out of the chamber. Because steps 312 and 314 are performed simultaneously, the surface activation process is an open-type process that does not trap contaminant particles in a sealed chamber.

The plasma activation process of step 312 may involve several steps. First, in step 312A, gas in introduced into the chamber, for example, by pumping gas from a gas inlet. The gas inlet may be a showerhead capable of controlling the flow speed of gas into the chamber. In step 312B, the gas over the wafer's surface is transformed into plasma using the top and bottom electrodes. For example, an appropriate bias power may be applied to the top and bottom electrodes, exciting the gas and creating plasma ions. The plasma interacts with and activates the wafer's surface materials, for example, improving their adhesive properties for subsequent bonding processes.

In step 312C, the density of plasma over the wafer surface may be measured, for example, using an OES device. In step 312D, a device such as a plasma density self-monitoring device, determines if the measured plasma density meets a desired plasma density. If not, in step 312E, the distance between the top and bottom electrodes may be adjusted accordingly by changing the relative vertical position of the top and/or bottom electrode. For example, if the measured plasma density level is lower than a desired plasma density, the distance between the top and bottom electrodes may be lessened. Additionally, the gas flow speed may be adjusted accordingly to meet the desired plasma density level. If the measured plasma density level meets the desired plasma density, then the plasma density may be continuously monitored. Thus, even though the surface activation process in the low contamination chamber is an open-type process, a desired plasma density is still maintained. Meeting the desired plasma density level may be done to ensure the quality of subsequently formed bonds between the wafer and another package.

Figure 3C:
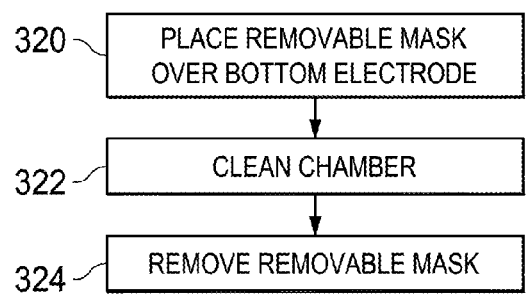

FIG. 3C illustrates a flow diagram of a chamber cleaning process for the low contamination chamber in accordance with various embodiments. The process illustrated by FIG. 3C may occur when the chamber is in an idle state (i.e., when the chamber is not being used for surface activation). In step 320, a removable mask is placed over a bottom electrode of the low contamination chamber using any suitable means, such as, a mechanical arm. The removable mask may cover an entire top surface of the bottom electrode to protect the surface during the cleaning process. In step 322, a cleaning process may occur in the chamber. The cleaning process may involve pumping a gas into the chamber, transforming the gas into plasma, and purging the gas/plasma from the chamber. The purging the gas and plasma removes residual contaminants from the chamber. In step 324, the removable mask is removed, and the chamber is ready to be used for surface activation. By removing residual contaminants during an idle state, the cleaning process reduces the chance of damage being caused by the contaminants to wafers placed in the chamber. The removable mask protects the bottom electrode, improving the durability of the chamber.

In accordance with an embodiment, a low contamination chamber includes a gas inlet, an adjustable top electrode, an adjustable bottom electrode, and an outlet. The chamber is configured to adjust a distance between the adjustable top and bottom electrodes in accordance with a desired density of plasma disposed between the top electrode and the bottom electrode.

In accordance with another embodiment, a low contamination chamber includes a gas inlet showerhead, top and bottom electrodes, a plasma density self-monitoring mechanism, top and bottom manipulators, and an outlet configured as an exhaust during a surface activation process. The plasma density self-monitoring mechanism monitors a density of plasma between the top and bottom electrodes. The top and bottom manipulators are configured to adjust a distance between the top and bottom electrodes in accordance with a monitored plasma density level and a desired plasma density level during a surface activation process.

In accordance with yet another embodiment, a method includes disposing a wafer between top and bottom electrodes in a chamber, activating a surface of the wafer, and exhausting excess gas and plasma from the chamber during the activating the surface of the wafer. Activating the surface of the wafer includes introducing gas into the chamber using a gas inlet showerhead, ionizing the gas over the surface of the wafer into plasma using the top and bottom electrodes, and adjusting a distance between the top and bottom electrodes to maintain a desired plasma density level.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    disposing a wafer between a top and a bottom electrodes in a chamber;
    activating a surface of the wafer by:
        introducing gas into the chamber using a gas inlet showerhead;
        ionizing the gas over the surface of the wafer into plasma using the top and the bottom electrodes; and
        adjusting a distance between the top and the bottom electrodes in response to a measured value of a plasma density during the ionizing the gas to maintain a desired plasma density level; and
    exhausting gas and plasma from the chamber during the activating the surface of the wafer.

2. The method of claim 1, further comprising cleaning the chamber after removing the wafer from the chamber.

3. The method of claim 2, wherein cleaning the chamber comprises:
    disposing a removable protective mask over the bottom electrode;
    removing a residual contaminant from the chamber after the disposing the removable protective mask; and
    removing the removable protective mask from the bottom electrode after the removing the residual contaminant.

4. The method of claim 1, wherein adjusting the distance between the top and the bottom electrodes comprises obtaining the measured value of the plasma density over the surface of the wafer using an optical emission spectroscopy (OES) device.

5. The method of claim 1, wherein activating the surface of the wafer comprises controlling, by the gas inlet showerhead, a gas flow speed of gas entering the chamber in accordance with the desired plasma density level.

6. A method comprising:
disposing a wafer between a top electrode and a bottom electrode in a chamber;
applying a plasma treatment to the wafer while the wafer is disposed between the top electrode and the bottom electrode;
adjusting a distance between the top electrode and the bottom electrode while applying the plasma treatment to maintain a desired plasma density over the wafer; and
after applying the plasma treatment, removing the wafer from the chamber.

7. The method of claim 6, wherein applying the plasma treatment comprises:
flowing gas into the chamber using a gas inlet; and
ionizing the gas flowed over the wafer by applying a charge to the top electrode and the bottom electrode.

8. The method of claim 7 further comprising adjusting a gas flow speed for flowing gas into the chamber in accordance with the desired plasma density over the wafer.

9. The method of claim 8, wherein adjusting the gas flow speed comprises controlling the gas inlet.

10. The method of claim 6 further comprising exhausting excess gas and plasma from the chamber during applying the plasma treatment.

11. The method of claim 6 further comprising after removing the wafer from the chamber, cleaning the chamber.

12. The method of claim 11, wherein cleaning the chamber comprises:
placing a protective mask to cover a top surface of the bottom electrode;
after placing the protective mask, pumping gas into the chamber;
transforming at least a portion of the gas into plasma;
purging the gas and the plasma from the chamber; and
after purging the gas and the plasma, removing the protective mask.

13. The method of claim 6, wherein applying the plasma treatment comprises continuously monitoring a plasma density level over the wafer.

14. A method comprising:
disposing a wafer on a bottom electrode in a chamber;
disposing a top electrode over the wafer; and
applying a plasma treatment to the wafer, wherein applying the plasma treatment comprises:
monitoring a plasma density over the wafer;
detecting that the plasma density over the wafer is outside a pre-determined range; and
adjusting a distance between the top electrode and the bottom electrode upon detecting that the plasma density over the wafer is outside the pre-determined range.

15. The method of claim 14, wherein adjusting the distance between the top electrode and the bottom electrode comprises decreasing the distance between the top electrode and the bottom electrode upon detecting that the plasma density over the wafer is less than a desired plasma density.

16. The method of claim 14, wherein monitoring the plasma density over the wafer comprises measuring the plasma density over the wafer using an optical emission spectroscopy (OES) device.

17. The method of claim 14, wherein applying the plasma treatment comprises continuing to monitor the plasma density over the wafer after the plasma density over the wafer falls within the pre-determined range.

18. The method of claim 14, wherein applying the plasma treatment comprises:
flowing gas into the chamber and over the wafer; and
ionizing at least a portion of gas to form plasma by applying a charge to the top electrode and the bottom electrode.

19. The method of claim 18, wherein applying the plasma treatment further comprises changing a speed of flowing the gas into the chamber upon detecting that the plasma density over the wafer is outside the pre-determined range.

20. The method of claim 18, further comprising exhausting gas and plasma from the chamber while applying the plasma treatment to the wafer.

* * * * *